US009204584B2

(12) United States Patent
Wang et al.

(10) Patent No.: US 9,204,584 B2
(45) Date of Patent: Dec. 1, 2015

(54) TESTING SYSTEM FOR TESTING A PORTABLE ELECTRONIC DEVICE

(71) Applicant: Wistron Corporation, New Taipei (TW)

(72) Inventors: Zhen Wang, New Taipei (TW); Wei Hu, New Taipei (TW); Bing Liao, New Taipei (TW); Bin Wang, New Taipei (TW); Yen-Wei Liao, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 346 days.

(21) Appl. No.: 13/970,609

(22) Filed: Aug. 20, 2013

(65) Prior Publication Data

US 2014/0345395 A1    Nov. 27, 2014

(30) Foreign Application Priority Data

May 23, 2013    (CN) .......................... 2013 1 0195919

(51) Int. Cl.
*G01M 99/00* (2011.01)
*H05K 13/00* (2006.01)
*G06F 11/26* (2006.01)
*G06F 11/273* (2006.01)

(52) U.S. Cl.
CPC ................ *H05K 13/00* (2013.01); *G06F 11/26* (2013.01); *G06F 11/2736* (2013.01)

(58) Field of Classification Search
None
See application file for complete search history.

(56) References Cited

U.S. PATENT DOCUMENTS

| 3,597,981 | A * | 8/1971 | Wakabayashi ...... | G01M 99/008 73/865.9 |
| 5,827,983 | A * | 10/1998 | Ortoli ..................... | G06F 11/26 714/E11.159 |
| 6,314,825 | B1 * | 11/2001 | Fan ..................... | G01M 99/008 73/865.3 |
| 6,581,483 | B1 * | 6/2003 | Yeh ..................... | G01M 99/007 73/865.3 |
| 8,099,253 | B1 * | 1/2012 | Rau ..................... | G01M 99/008 400/473 |
| 2013/0152711 | A1 * | 6/2013 | Xu ...................... | G06F 11/2221 73/865.9 |

* cited by examiner

*Primary Examiner* — Robert R Raevis
(74) *Attorney, Agent, or Firm* — Winston Hsu; Scott Margo

(57) ABSTRACT

A testing system includes a base, a frame installed on the base, a platform, a first driving mechanism, a second driving mechanism, a locating component, a third driving mechanism and a control unit. Two guiding tracks and a sliding component which slides along the two guiding tracks are disposed under two sides of the platform. The second driving mechanism is connected to the sliding component, and the third driving mechanism is disposed on the sliding component and connected to the locating component. The control unit is for controlling the first driving mechanism to drive the platform to move in a first direction, so that the locating component presses a portable electronic device disposed on the base. The control unit is further for controlling the second driving mechanism and the third driving mechanism to drive the locating component to move in a second direction and a third direction.

17 Claims, 14 Drawing Sheets

TESTING SYSTEM FOR TESTING A PORTABLE ELECTRONIC DEVICE

BACKGROUND OF THE INVENTION

1. Field of the Invention

The present invention relates to a testing system, and more specifically, to a testing system for testing a portable electronic device.

2. Description of the Prior Art

In the modern market, a portable electronic device, such as a notebook computer, is widespread and very popular. In order to ensure good quality of the products, the notebook computer is tested with various tests before delivery, so as to ensure that every function of the notebook computer can perform normally. For example, it can test whether there are broken buttons of a keyboard, can test whether a display module of the portable electronic device displays images normally, or can test whether a touch module operates normally. However, every test described above has to be performed by an operator in factory, resulting in wasting a lot of manpower and time. Therefore, it is an important issue to design a test system for testing the portable electronic device automatically.

SUMMARY OF THE INVENTION

The present invention is to provide a testing system for testing a portable electronic device to solve above problems.

According to the disclosure, a testing system includes a base, a frame, two connecting components, a platform, a first driving mechanism, a second driving mechanism, a guiding component, a locating component, a third driving mechanism and a control unit. The base is for supporting the portable electronic device. The frame is installed on the base. The platform is disposed between the base and the frame and movably installed on the two connecting components. Two guiding tracks and a sliding component are respectively disposed under two sides of the platform, and the sliding component is slidably installed on the two guiding tracks. The first driving mechanism is connected to the platform for driving the platform to move in a first direction along the two connecting components. The second driving mechanism is connected to the sliding component, and the second driving mechanism is for driving the sliding component to move in a second direction along the two guiding tracks. Two ends of the guiding component are connected to two ends of the sliding component respectively. The locating component sheathes the guiding component, and the locating component includes a roller. The third driving mechanism is disposed on the sliding component and connected to the locating component, and the third driving mechanism is for driving the locating component to move in a third direction along the guiding component. The control unit is for controlling the first driving mechanism to drive the platform to move in the first direction, so that the roller of the locating component presses the portable electronic device. The control unit is further for controlling the second driving mechanism and the third driving mechanism to drive the locating component to move in the second direction and the third direction.

According to the disclosure, the first driving mechanism includes a first driving rod and a first driving component. The first driving rod is connected to the platform. The first driving component is installed on the frame and connected to the first driving rod, and the first driving component is for driving the first driving rod to move the platform in the first direction along the two connecting components.

According to the disclosure, the second driving mechanism includes a moving component, a second driving rod and a second driving component. The moving component is connected to the sliding component. The second driving rod passes through the moving component. The second driving component is connected to the second driving rod, and the second driving component is for driving the second driving rod to move the moving component in the second direction, so as to drive the sliding component to move in the second direction along the two guiding tracks.

According to the disclosure, the third driving mechanism further includes a third driving rod and a third driving component. The third driving rod passes through the locating component and connected to the sliding component. The third driving component is connected to the third driving rod, and the third driving component is for driving the third driving rod to move the locating component in the third direction along the guiding component.

According to the disclosure, the first driving component is a cylinder, and the second driving component and the third driving component are motors, respectively.

According to the disclosure, the testing system further includes a testing rod and a fourth driving mechanism. The fourth driving mechanism is installed on the locating component and connected to the testing rod, and the control unit is further for controlling the fourth driving mechanism to drive the testing rod and controlling the second driving mechanism and the third driving mechanism to drive the locating component, so as to drive the fourth driving mechanism and the testing rod, so that the testing rod contacts against a touch module of the portable electronic device.

According to the disclosure, an end of the testing rod which is for contacting against the touch module is made of conductive material with a print, and the control unit is further for controlling the fourth driving mechanism to drive the testing rod, so that the end of the testing rod contacts against a fingerprint identification module of the portable electronic device.

According to the disclosure, the fourth driving mechanism is a cylinder.

According to the disclosure, the roller is made of resilient material.

According to the disclosure, the testing further includes a distance sensing unit electrically connected to the control unit and disposed on an end of the platform nearby the portable electronic device for sensing a distance between a display module of the portable electronic device and the end of the platform, and the control unit being further for controlling operation of the testing system according to a sensing result of the distance sensing unit.

According to the disclosure, the distance sensing unit is an ultrasound sensing device.

According to the disclosure, the testing system further includes a fixing frame and a reflecting component. The reflecting component is disposed on the fixing frame, and the reflecting component is for reflecting an image displayed on a display module of the portable electronic device, so that an image capturing module of the portable electronic device captures the image reflected by the reflecting component, so as to determine whether the display module and the image capturing module operate normally according to the image reflected by the reflecting component and captured by the image capturing module.

According to the disclosure, the testing system further includes a plug testing unit electrically connected to the control unit, and the plug testing unit includes a supporting component and a plug module. The supporting component is disposed on the base for supporting the portable electronic device. The plug module is disposed on the supporting component, and the plug module is aligned to a socket of the portable electronic device. The control unit is further for controlling the plug module to insert into or unplug from the socket.

According to the disclosure, the plug module includes a plug component, a pushing component, two guiding blocks and a cylinder. The plug component is for inserting into the socket. The pushing component is connected the plug component. The two guiding blocks are for guiding movement of the pushing component. The cylinder is connected to the pushing component, and the control unit is further for controlling the cylinder to drive the pushing component to drive the plug component to insert into the socket of the portable electronic device.

According to the disclosure, at least one positioning column is disposed on the base, at least one positioning hole is disposed on the supporting component, and the at least one positioning column is engaged with the at least one positioning hole, so as to locate the supporting component on the base.

According to the disclosure, at least one positioning component is disposed on the supporting component, and the at least one positioning component is for inserting into an opening of the portable electronic device, so as to position the portable electronic device on the supporting component.

According to the disclosure, the testing system further includes a foolproof unit disposed on the supporting component and electrically connected to the control unit, the foolproof unit being for generating a signal as the portable electronic device is disposed on the supporting component to press the foolproof unit, and the control unit being further for controlling the plug testing unit as receiving the signal generated by the foolproof unit.

The testing system of the present invention includes the first driving mechanism, the second driving mechanism, the third driving mechanism and the control unit. As the control unit controls the first driving mechanism to drive the platform to get close to the portable electronic device, and the control unit controls the second driving mechanism and the third driving mechanism to drive the locating component to press the portable electronic device, so that it can test whether the keyboard module, the touch module, the fingerprint identification module, the display module and the image capturing module operate normally. In addition, the testing system further includes the plug testing unit, and the control unit controls the plug testing unit to test whether the sockets of the portable electronic device operate normally. Therefore, the testing system of the present invention can solve the conventional problem that all tests have to be performed by the operator in factory, resulting in wasting a lot of manpower and time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
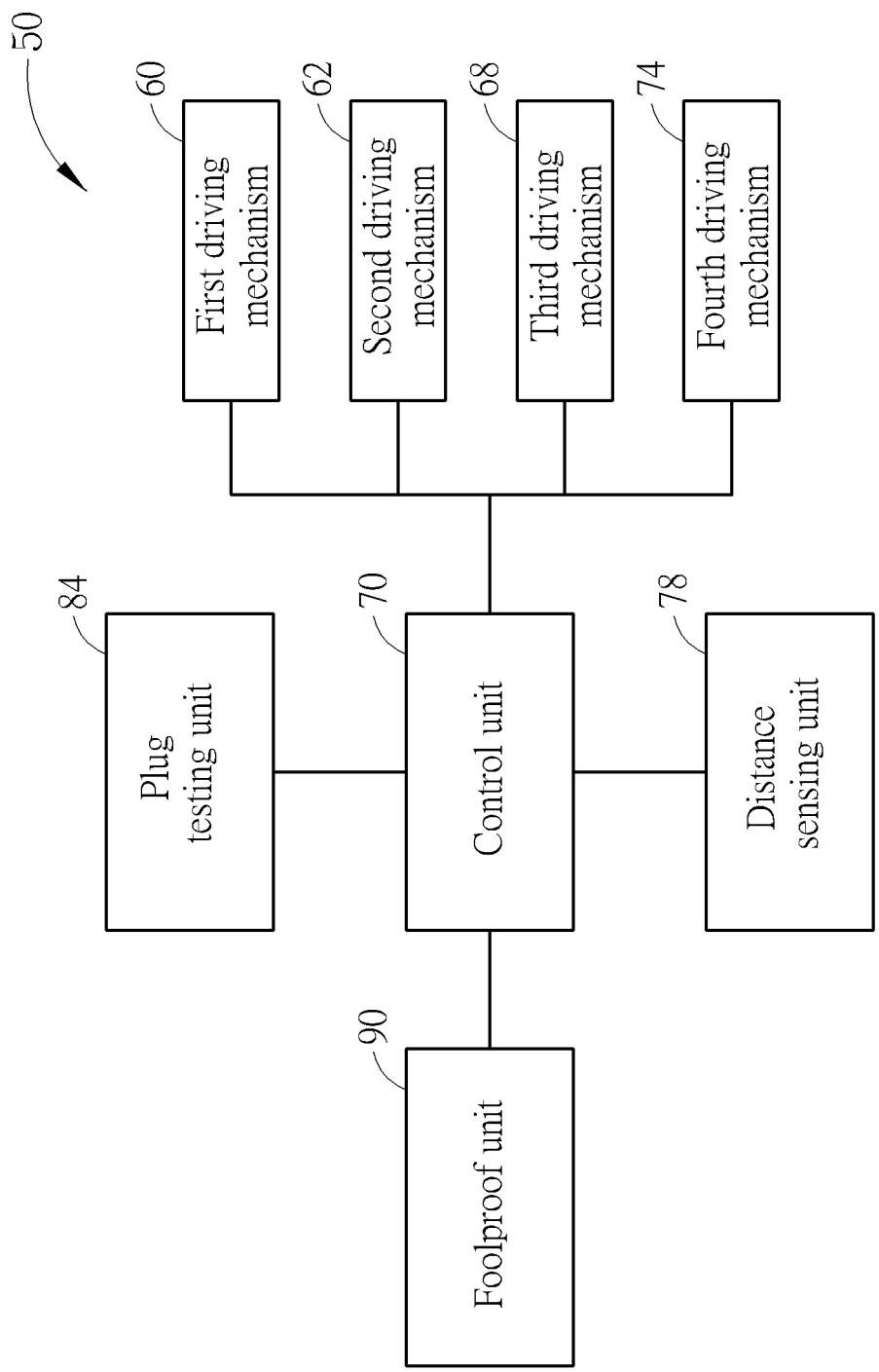
FIG. 1 is a functional diagram of a testing system according to an embodiment of the present invention.
Figure 2:
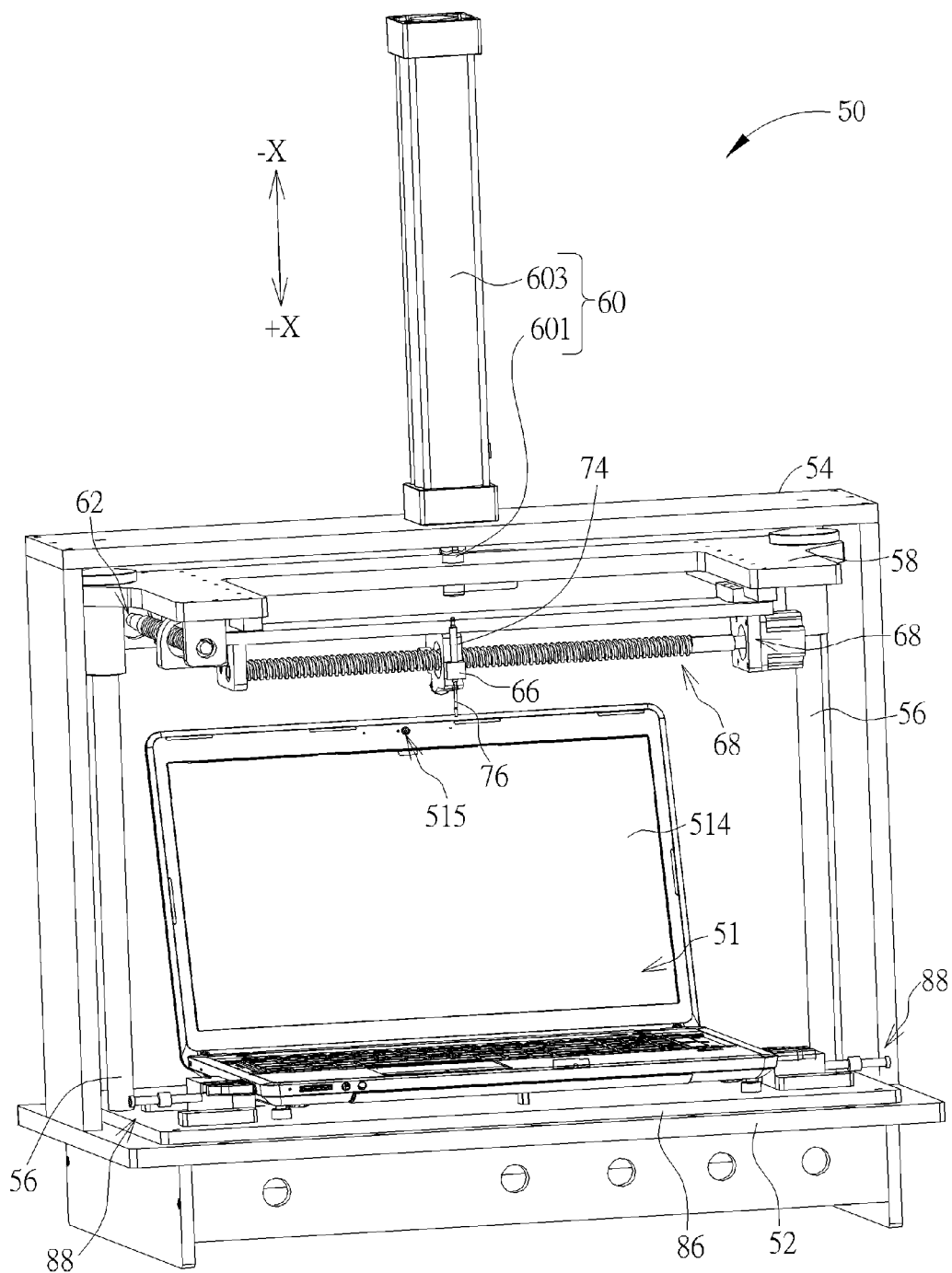
FIG. 2 is a structural diagram of the testing system according to the embodiment of the present invention.
Figure 3:
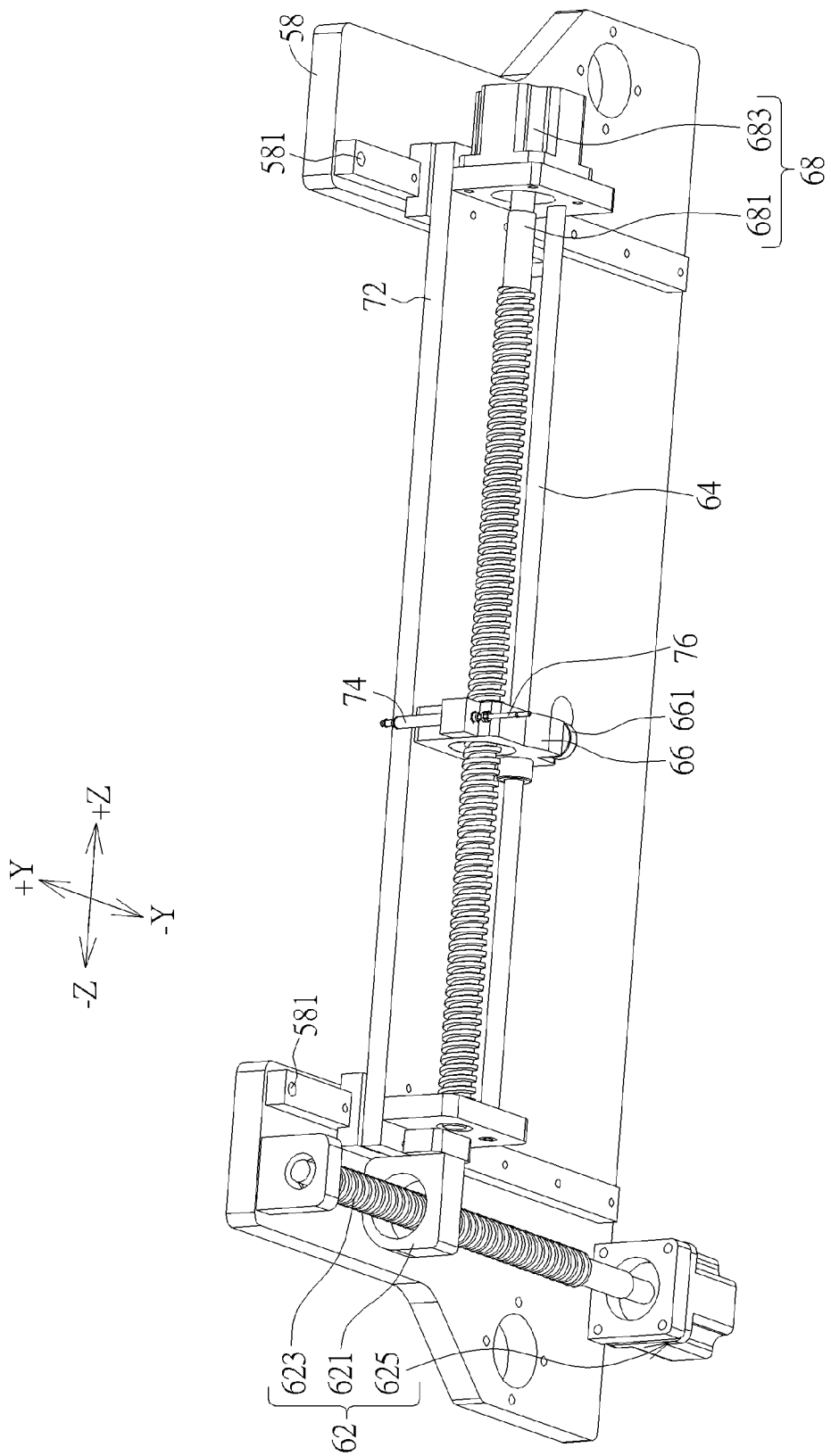
FIG. 3 is a partial diagram of the testing system according to the embodiment of the present invention.

Please refer to FIG. 1 to FIG. 3. FIG. 1 is a functional diagram of a testing system 50 according to an embodiment of the present invention. FIG. 2 is a structural diagram of the testing system 50 according to the embodiment of the present invention. FIG. 3 is a partial diagram of the testing system 50 according to the embodiment of the present invention. The testing system 50 of the present invention is for testing a portable electronic device 51, such as a notebook computer. The testing system 50 includes a base 52, a frame 54, two connecting components 56, a platform 58, a first driving mechanism 60, a second driving mechanism 62, a guiding component 64, a locating component 66, a third driving mechanism 68 and a control unit 70. The base 52 is for supporting the portable electronic device 51, and the frame 54 is installed on the base 52. As shown in FIG. 2, the platform 58 is disposed between the base 52 and the frame 54 and movably installed on the two connecting components 56. As shown in FIG. 3, two guiding tracks 581 and a sliding component 72 are respectively disposed under two sides of the platform 58, and the sliding component 72 is slidably installed on the two guiding tracks 581. The first driving mechanism 60 is connected to the platform 58 for driving the platform 58 to move in a first direction (±X direction) along the two connecting components 56. Each connecting component 56 can be a rod component. The first driving mechanism 60 includes a first driving rod 601 and a first driving component 603. The first driving rod 601 is connected to the platform 58, and the first driving component 603 is installed on the frame 54 and connected to the first driving rod 601. The first driving component 603 is for driving the first driving rod 601 to move in the first direction (±X direction) along the two connecting components 56. In this embodiment, the first driving component 603 can be a cylinder, and the first driving rod 601 can be a cylinder arm, but are not limited to it.

As shown in FIG. 3, the second driving mechanism 62 is connected to the sliding component 72, and the second driving mechanism 62 is for driving the sliding component 72 to move in a second direction (±Y direction) along the two guiding tracks 581. The second driving mechanism 62 includes a moving component 621, a second driving rod 623 and a second driving component 625. The moving component 621 is connected to the sliding component 72, so that the moving component 621 can be driven by the sliding component 72 simultaneously to move in the first direction (±X direction) as the sliding component 72 moves in the first direction (±X direction). The second driving rod 623 passes through the moving component 621, and the second driving component 625 is connected to the second driving rod 623. Therefore, the second driving component 625 is for driving the second driving rod 623 to drive the moving component 621 to move in the second direction (±Y direction), so as to drive the sliding component 72 to move in the second direction (±Y direction) along the two guiding tracks 581. Two ends of the guiding component 64 are connected to two ends of the sliding component 72 respectively. The locating component 66 includes a roller 661, and the roller 661 can be made of resilient material. The locating component 66 sheathes the guiding component 64, so that the locating component 66 can move back and forth along the guiding component 64. The third driving mechanism 68 is disposed on the sliding component 72 and connected to the locating component 66. The third driving mechanism 68 is for driving the locating component 66 to move in a third direction (±Z direction) along the guiding component 64. As shown in FIG. 3, the third driving mechanism 68 includes a third driving rod 681 and a third driving component 683. The third driving rod 681 passes through the locating component 66 and is connected to an end of the sliding component 72 which is close to the second driving mechanism 62. The third driving component 683 is connected to the third driving rod 681, and the third driving component 683 is for driving the third driving rod 681 to move the locating component 66 in the third direction (±Z direction) along the guiding component 64. In this embodiment, the second driving component 625 and the third driving component 683 can be motors, respectively, and the second driving rod 623 and the third driving rod 681 can be screws, respectively, but are not limited to it. All mechanisms for driving the moving component 621 and the locating component 66 are within the scope of the present invention.

Figure 4:
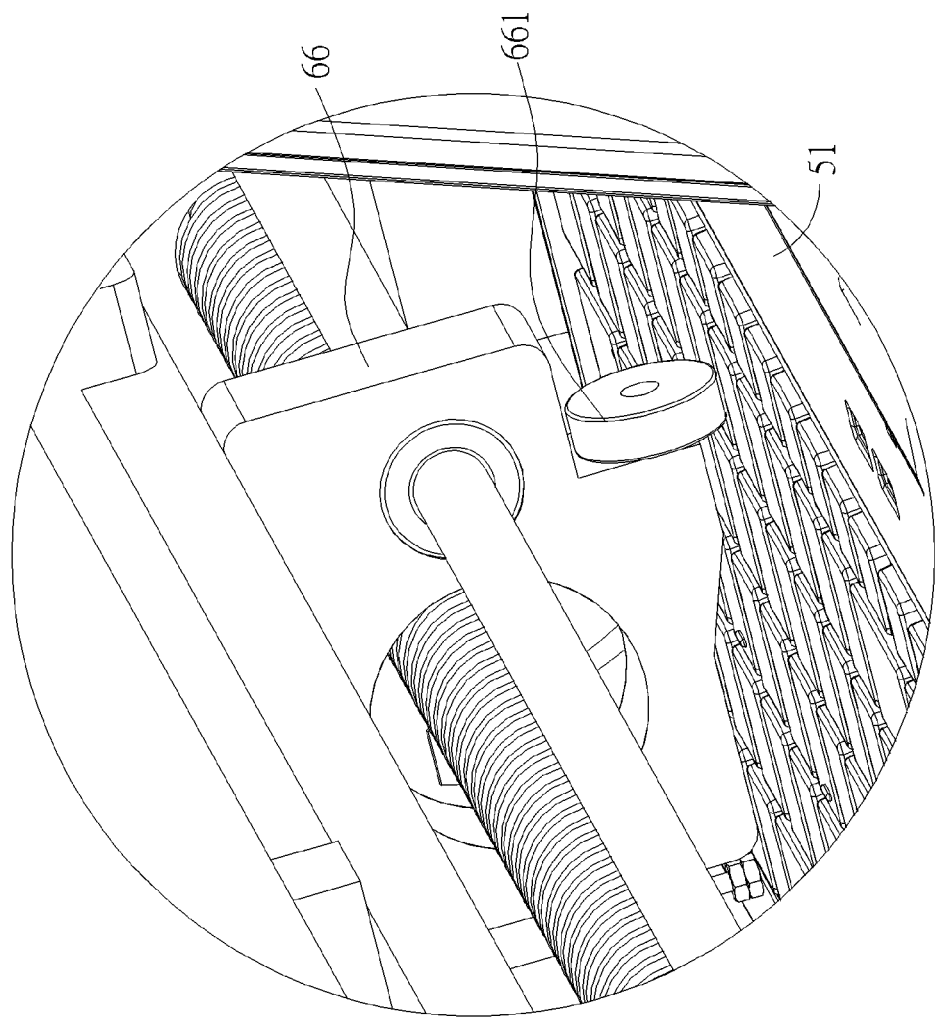
FIG. 4 is a diagram illustrating that a roller presses a portable electronic device according to the embodiment of the present invention.

Please refer to FIG. 1 to FIG. 4. FIG. 4 is a diagram illustrating that the roller 661 presses the portable electronic device 51 according to the embodiment of the present invention. As shown in FIG. 1, the first driving component 603, the second driving mechanism 62 and the third driving mechanism 68 are electrically connected to the control unit 70, so that the control unit 70 can control the first driving mechanism 60 to drive the platform 58 to move in the first direction (±X direction), so as to make the roller 661 of the locating component 66 press the portable electronic device 51. As shown in FIG. 4, the roller 661 of the locating component 66 is for pressing a keyboard module of the portable electronic device 51. Then, the control unit 70 is further for controlling the second driving mechanism 62 and the third driving mechanism 68 to drive the locating component 66 to move in the second direction (±Y direction) and in the third direction (±Z direction) on the keyboard module of the portable electronic device 51. That is, the control unit 70 can control the second driving mechanism 62 and the third driving mechanism 68 to move in a predetermined path, so that the roller 661 of the locating component 66 moves in the second direction (±Y direction) and in the third direction (±Z direction) to press all of buttons of the keyboard module once, so as to achieve a purpose of testing whether each button of the keyboard module operates normally.

Figure 5:
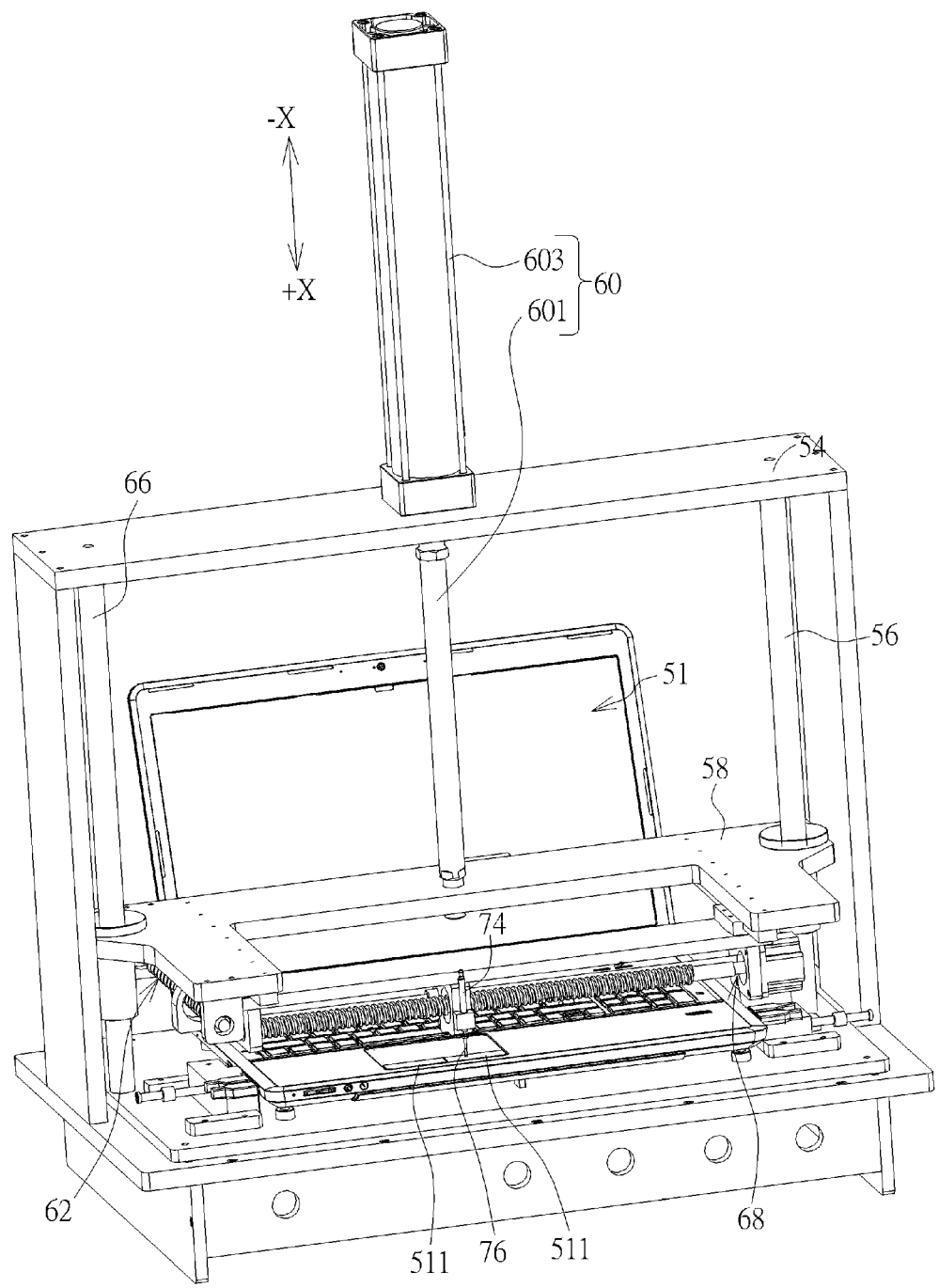
FIG. 5 is a diagram of the testing system in another state according to the embodiment of the present invention.
Figure 6:
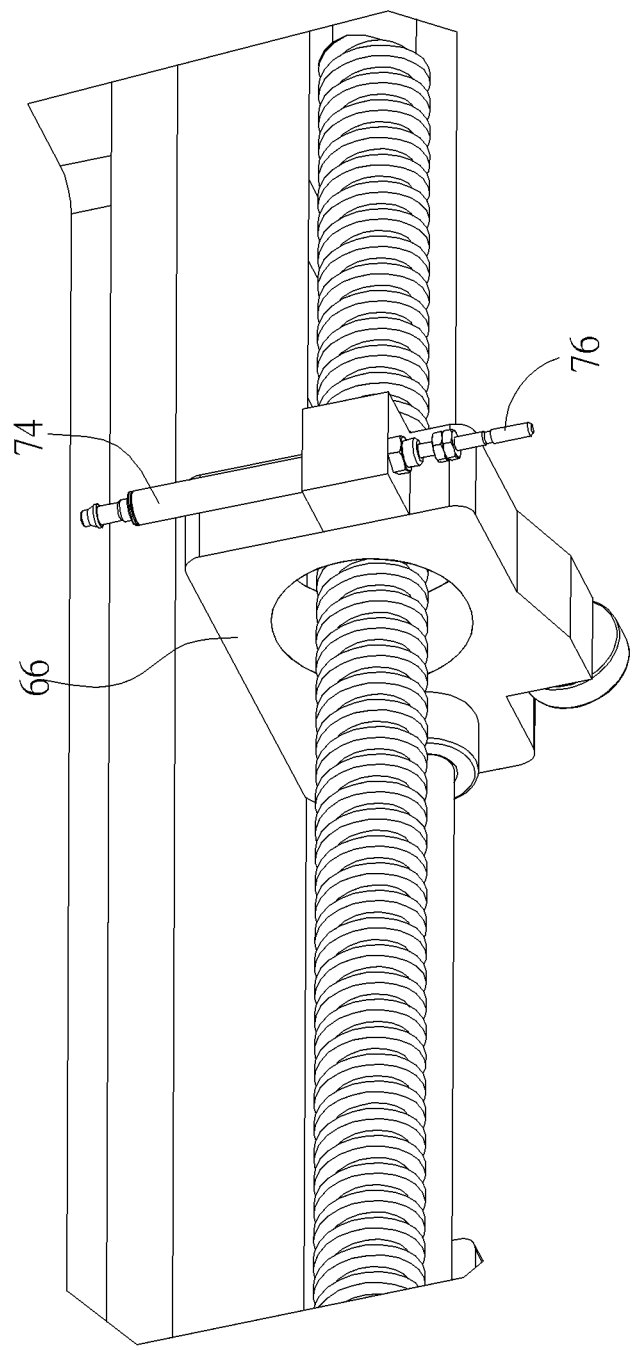
FIG. 6 is an enlarged diagram of a fourth driving mechanism and a testing rod according to the embodiment of the present invention.

Please refer to FIG. 1 and FIG. 5 to FIG. 6. FIG. 5 is a diagram of the testing system 50 in another state according to the embodiment of the present invention. FIG. 6 is an enlarged diagram of a fourth driving mechanism 74 and a testing rod 76 according to the embodiment of the present invention. In this embodiment, the testing system 50 further includes the fourth driving mechanism 74 and the testing rod 76. The fourth driving mechanism 74 can be a cylinder, such as a tiny moving pen-type cylinder for performing a tiny movement, but is not limited to it. The fourth driving mechanism 74 is installed on the locating component 66 and connected to the testing rod 76. The control unit 70 is further for controlling the fourth driving mechanism 74 to drive the testing rod 76 and for controlling the second driving mechanism 62 and the third driving mechanism 68 to drive the locating component 66, so as to drive the fourth driving mechanism 74 and the testing rod 76, so that the testing rod 76 contacts against a touch module of the portable electronic device 51. As shown in FIG. 1 and FIG. 5, the control unit 70 can control the first driving mechanism 60 to drive the platform 58 to move in the first direction (±X direction), so that the testing rod 76 gets close to the portable electronic device 51. Then, the control unit 70 controls the second driving mechanism 62 and the third driving mechanism 68 to drive the locating component 66, so as to drive the fourth driving mechanism 74 and the testing rod 76 to be aligned to the touch module of the portable electronic device 51. Finally, the control unit 70 controls the fourth driving mechanism 74 to drive the testing rod 76 to press two buttons 511 of the touch module in the first direction (±X direction), so as to achieve a purpose of testing whether two buttons 511 of the touch module operate normally, as shown in FIG. 5.

Figure 7:
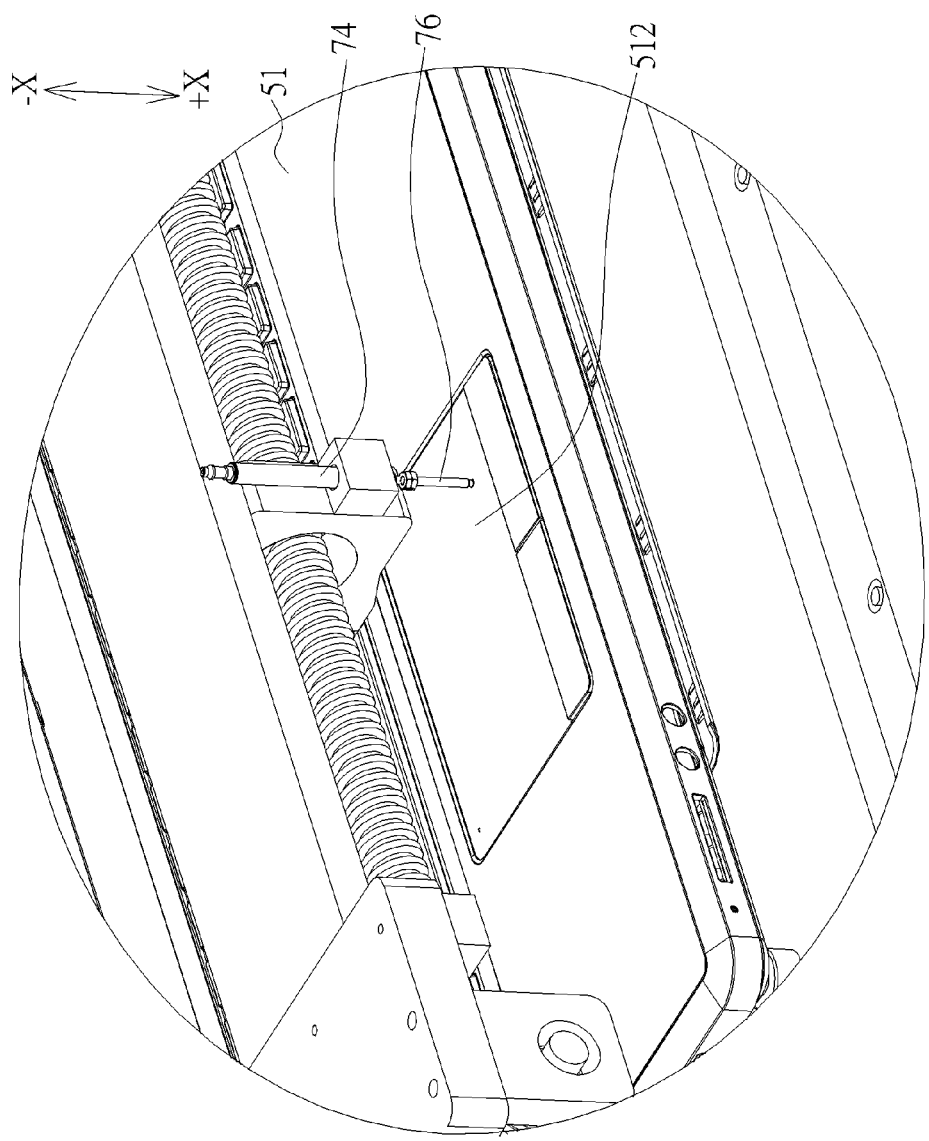
FIG. 7 is a diagram illustrating that the testing rod presses a touchpad according to the embodiment of the present invention.
Figure 8:
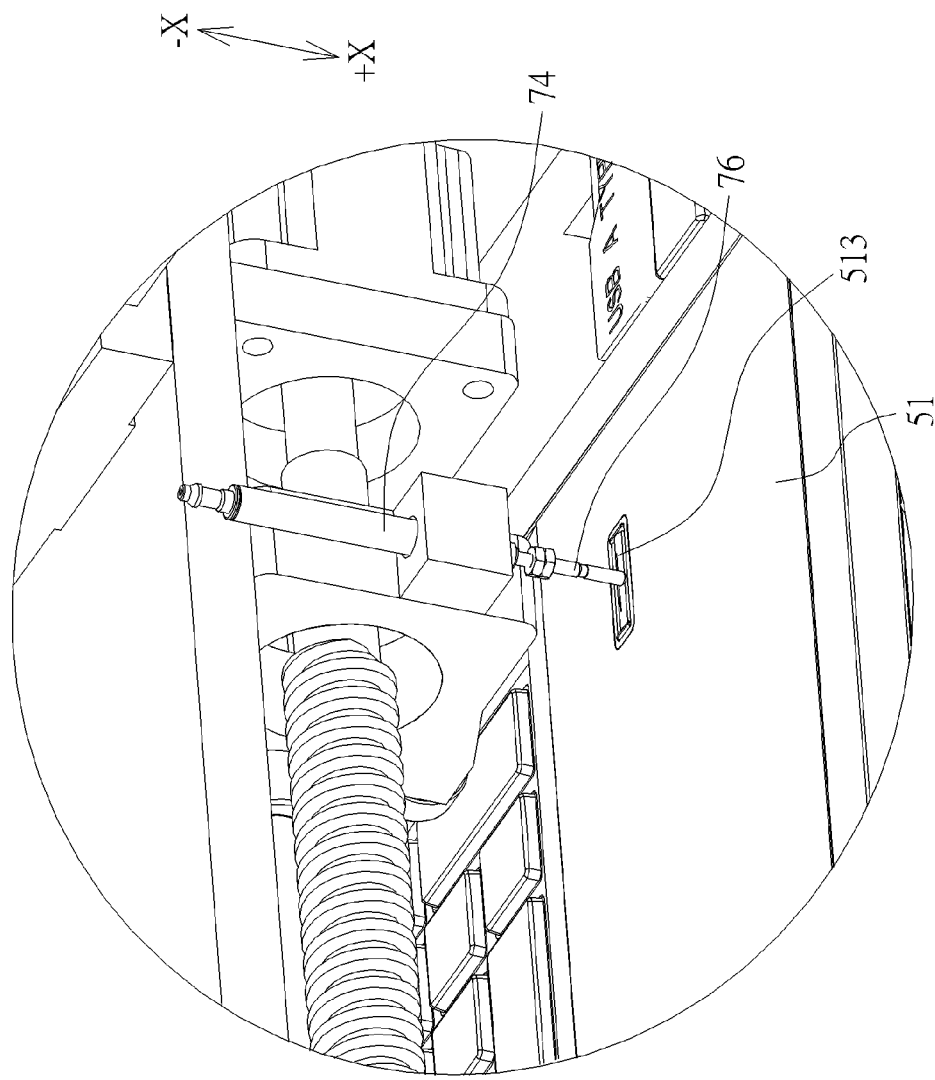
FIG. 8 is a diagram illustrating the testing rod contacts against a fingerprint identification module according to the embodiment of the present invention.

Moreover, the testing rod 76 can be further for testing a touchpad 512 of the touch module of the portable electronic device 51 and a fingerprint identification module 513 of the portable electronic device 51. Please refer to FIG. 7 and FIG. 8 with other figures. FIG. 7 is a diagram illustrating that the testing rod 76 presses the touchpad 512 according to the embodiment of the present invention. FIG. 8 is a diagram illustrating the testing rod 76 contacts against the fingerprint identification module 513 according to the embodiment of the present invention. As shown in FIG. 7, the testing rod 76 is made of conductive material, so that the testing rod 76 can be simulated as a human's fingerprint to touch the touchpad 512, so as to achieve a purpose of testing whether the touchpad 512 operates normally. After the control unit 70 controls the fourth driving mechanism 74 to drive the testing rod 76 to touch the touchpad 512, the control unit 70 can control the second driving mechanism 62 and the third driving mechanism 68, so that the testing rod 76 moves from an upper left corner to a lower right corner, and then moves from the lower right corner to an upper right corner. Finally, the testing rod 76 moves from the upper right corner to a lower left corner, so as to ensure that a touch function can operate normally in all positions of the touchpad 512. As shown in FIG. 8, the testing rod 76 is further for testing the fingerprint identification module 513 of the portable electronic device 51. In this embodiment, an end of the testing rod 76 for contacting against the touch module is made of conductive material with a print. Therefore, the testing rod 76 with the print can be simulated as the human's fingerprint. The control unit 70 is further for controlling the fourth driving mechanism 74 to drive the testing rod 76, so that the end of the testing rod 76 contacts against the fingerprint identification module 513 of the portable electronic device 51, so as to achieve a purpose of testing whether the fingerprint identification module 513 operates normally.

Figure 9:
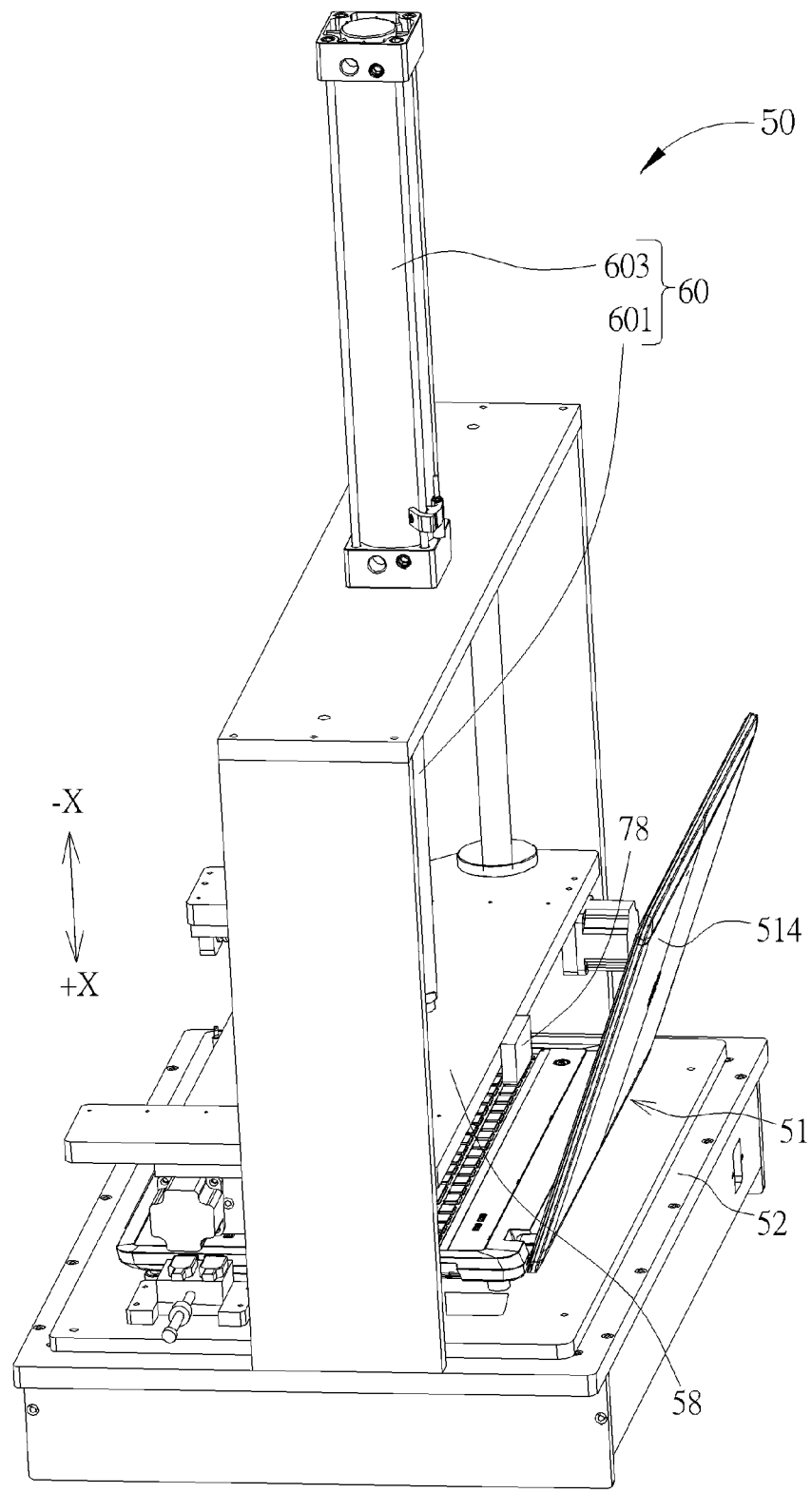
FIG. 9 is a diagram of the testing system in another view according to the embodiment of the present invention.

Please refer to FIG. 9. FIG. 9 is a diagram of the testing system 50 in another view according to the embodiment of the present invention. The testing system 50 can further include a distance sensing unit 78 electrically connected to the control unit 70. The distance sensing unit 78 is disposed on an end of the platform 58 nearby the portable electronic device 51 for sensing a distance between a display module 514 of the portable electronic device 51 and the end of the platform 58, and the control unit 70 is further for controlling the operation of the testing system 50 according to a sensing result of the distance sensing unit. In a procedure of controlling the first driving mechanism 60 to drive the platform 58 to move in the first direction (±X direction) by the control unit 70, the control unit 70 further controls the distance sensing unit 78 to sense the distance between the display module 514 and the end of the platform 58. As the sensed distance between the display module 514 and the end of the platform 58 is less than a predetermined distance, the control unit 70 stops the operation of the first driving mechanism 60 accordingly, so as to prevent the platform 58 from colliding the display module 514 of the portable electronic device 51. In this embodiment, the distance sensing unit 78 can be an ultrasound sensing device, but is not limited to it. All devices capable of sensing the distance are within the scope of the present invention. For example, the distance sensing unit 78 also can be a laser sensing device.

Figure 10:
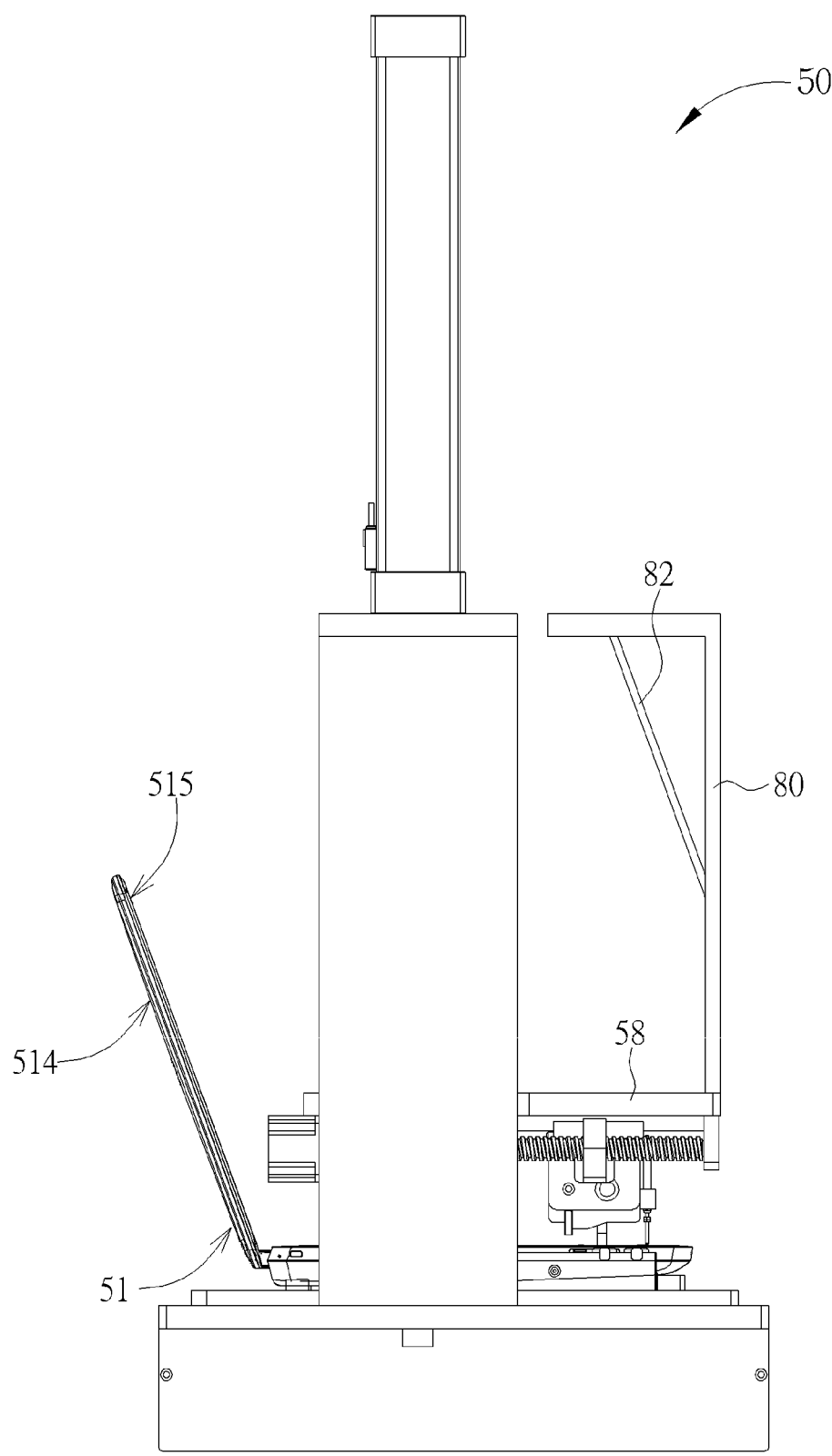
FIG. 10 is a side view of the testing system according to the embodiment of the present invention.

Please refer to FIG. 10. FIG. 10 is a side view of the testing system 50 according to the embodiment of the present invention. The testing system 50 can further include a fixing frame 80 and a reflecting component 82. As shown in FIG. 10, the fixing frame 80 is connected to an end of the platform 58. The reflecting component 82 is disposed on the fixing frame 80, and the reflecting component 82 is for reflecting an image displayed on the display module 514 of the portable electronic device 51, so that an image capturing module 515 of the portable electronic device 51 captures the image reflected by the reflecting component 82, so as to determine whether the display module 514 and the image capturing module 515 operate normally according to the image reflected by the reflecting component 82 and captured by the image capturing module 515. For example, it can analyze whether the image captured by the image capturing module 515 is abnormal by the software embedded in the portable electronic device 51, so as to test whether the image capturing module 515 captures the image correctly and whether the display module 514 displays the image normally.

Figure 11:
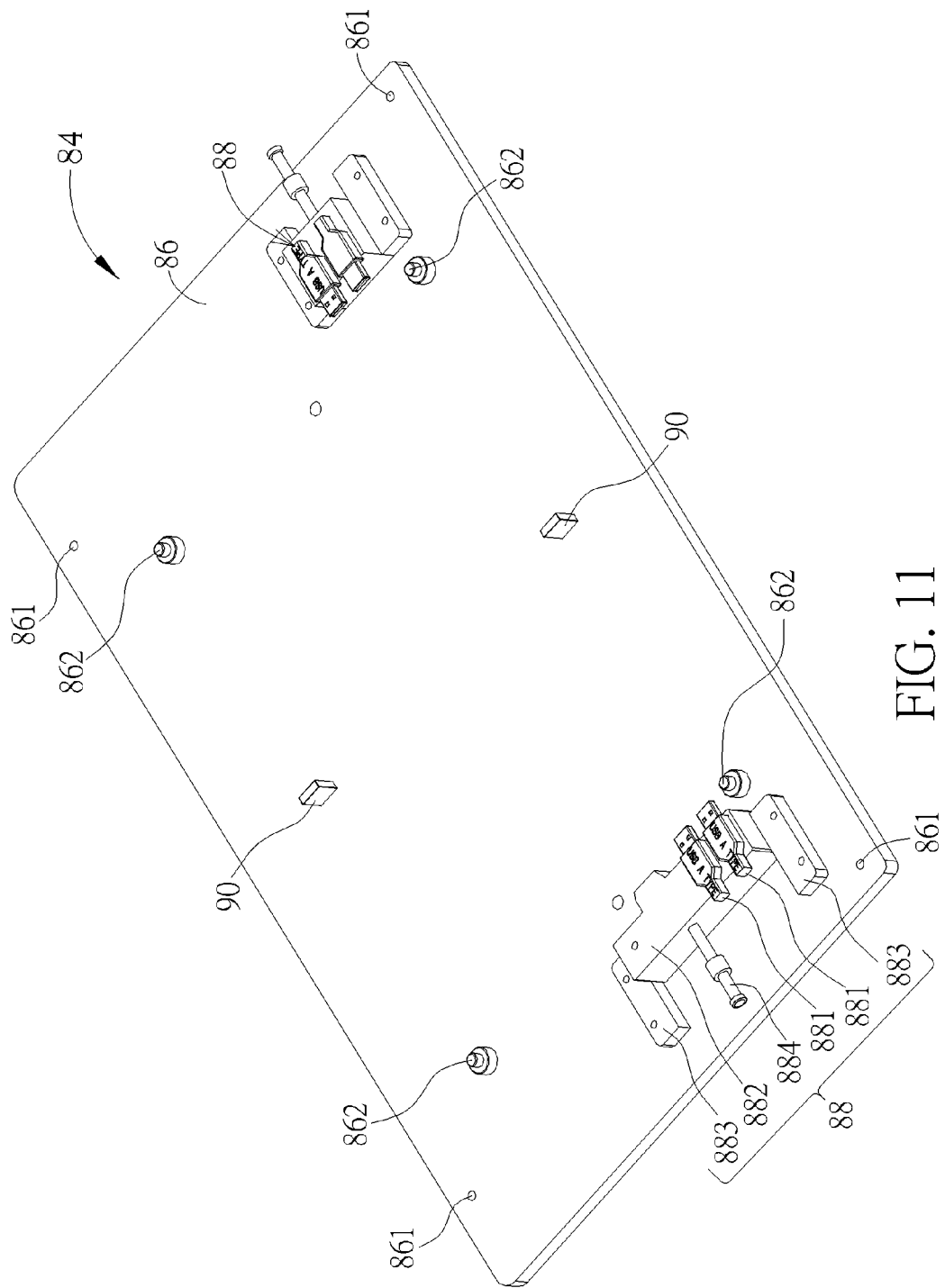
FIG. 11 is a diagram of a plug testing unit according to the embodiment of the present invention.
Figure 12:
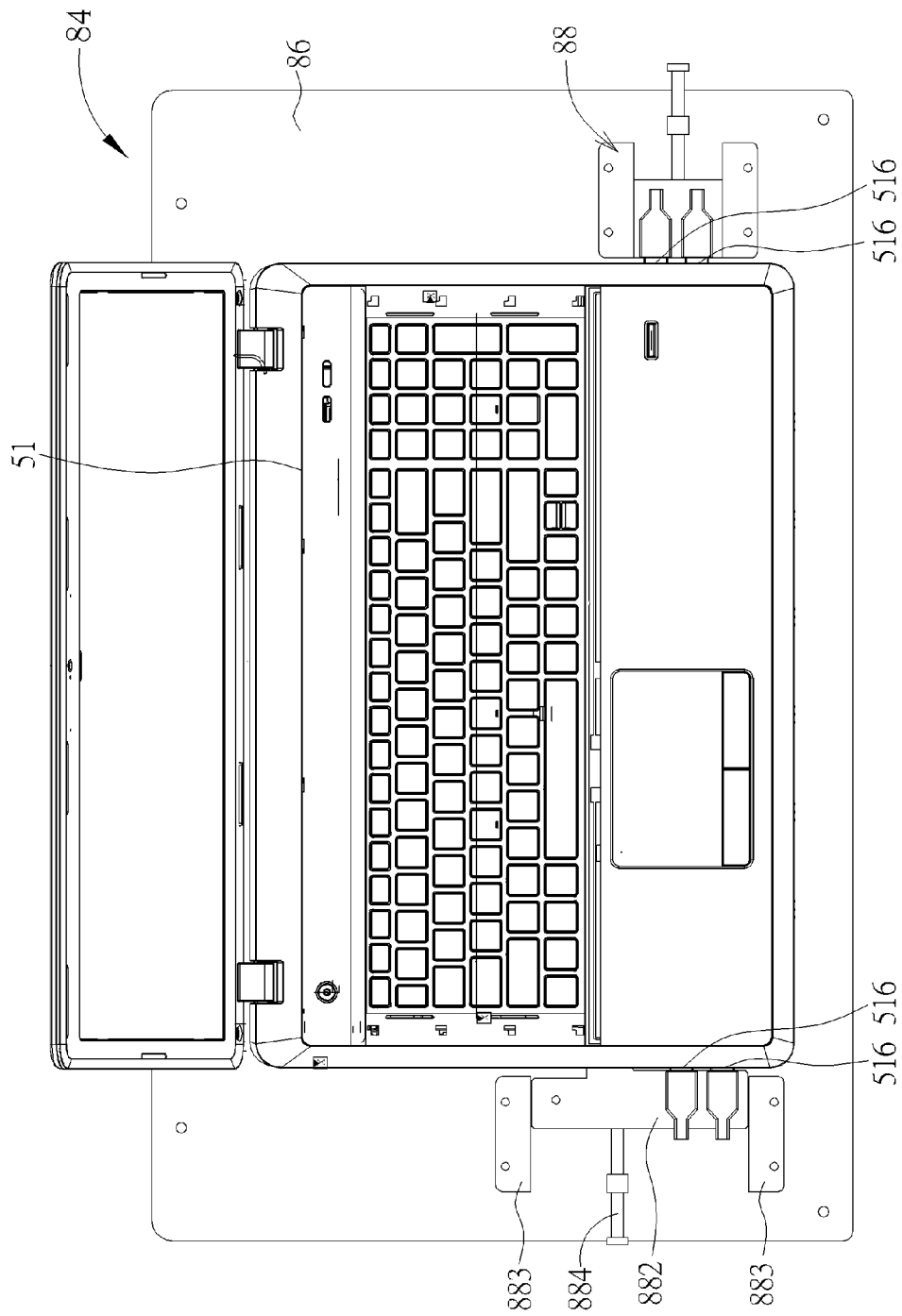
FIG. 12 is a diagram illustrating that the portable electronic device is disposed on the plug testing unit according to the embodiment of the present invention.
Figure 13:
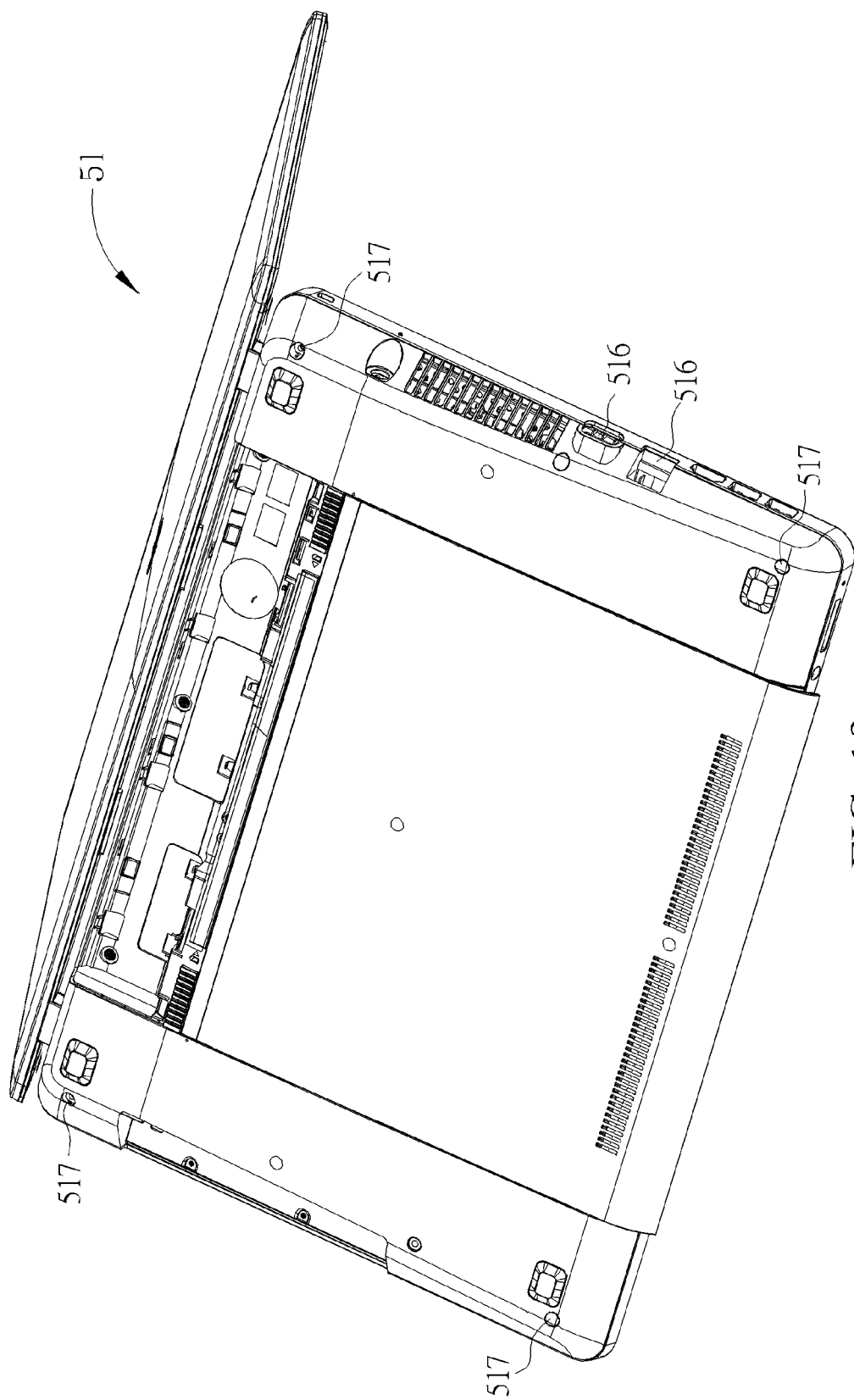
FIG. 13 is a diagram of the portable electronic device according to the embodiment of the present invention.
Figure 14:
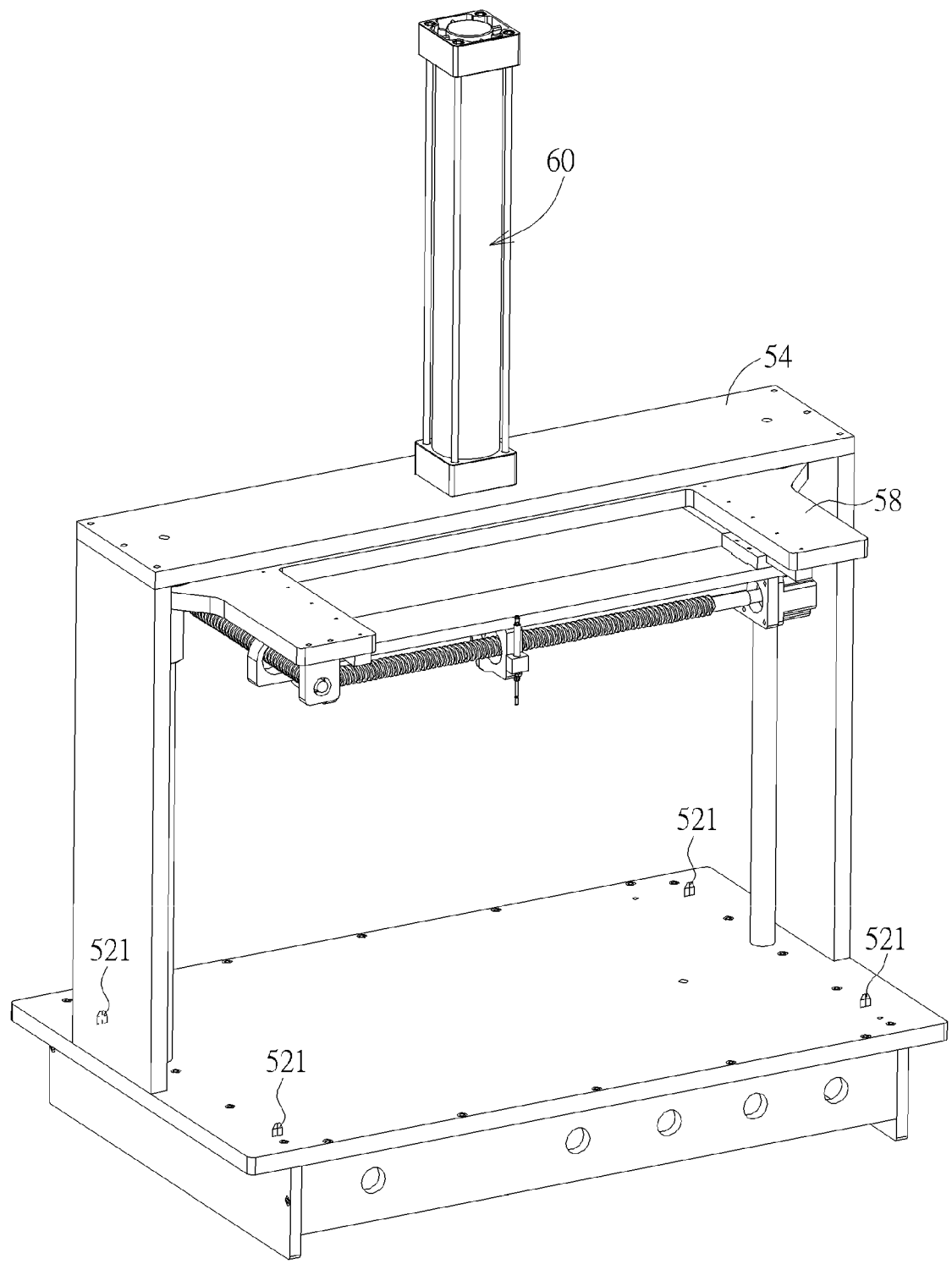
FIG. 14 is a diagram of a base of the testing system according to the embodiment of the present invention.

Please refer to FIG. 2 and FIG. 11 to FIG. 14. FIG. 11 is a diagram of a plug testing unit 84 according to the embodiment of the present invention. FIG. 12 is a diagram illustrating that the portable electronic device 51 is disposed on the plug testing unit 84 according to the embodiment of the present invention. FIG. 13 is a diagram of the portable electronic device 51 according to the embodiment of the present invention. FIG. 14 is a diagram of the base 52 of the testing system 50 according to the embodiment of the present invention. The plug testing unit 84 is electrically connected to the control unit 70, and the plug testing unit 84 includes a supporting component 86 and at least one plug module 88. As shown in FIG. 11, the testing system 50 of the present invention includes two plug modules 88. Amounts and positions of the plug module 88 are not limited to this embodiment, and it depends on practical design demands. As shown in FIG. 2 and FIG. 12, the supporting component 86 is disposed on the base 52 for supporting the portable electronic device 51, and the plug module 88 is disposed on the supporting component 86. The plug module 88 is aligned to a socket 516 of the portable electronic device 51 corresponding to the plug module 88, and the control unit 70 is further for controlling the plug module 88 to insert into or unplug from the socket 516, so as to test whether the socket 516 functions normally. As shown in FIG. 11 and FIG. 12, the plug module 88 includes at least one plug component 881, a pushing component 882, two guiding blocks 883 and a cylinder 884. The at least one plug component 881 is for inserting into the socket 516. In this embodiment, the plug module 88 can include two plug components 881. The pushing component 882 is connected to the two plug components 881, and the two guiding blocks 883 is for guiding movement of the pushing component 882. The cylinder 884 is connected to the pushing component 882, and the control unit 70 is further for controlling the cylinder 884 to drive the pushing component 882 to drive the plug component 881 to insert into the socket 516 of the portable electronic device 51 corresponding to the plug module 88. The control unit 70 can control the plug module 88 to insert into or unplug from the socket 516, so as to test whether the socket 516 functions normally.

Please refer to FIG. 11 and FIG. 14. In this embodiment, at least one positioning column 521 is disposed on the base 52, and at least one positioning hole 861 is disposed on the supporting component 86. The at least one positioning column 521 is engaged with the at least one positioning hole 861, so as to locate the supporting component 86 on the base 52. In this embodiment, four positioning columns 521 are disposed on the base 52, and four positioning holes 861 are disposed on the supporting component 86. Amounts and positions of the positioning column 521 and the positioning hole 861 are not limited to this embodiment, and it depends on practical design demands. Moreover, please refer to FIG. 1, FIG. 11 and FIG. 13. At least one positioning component 862 is disposed on the supporting component 86 for inserting into an opening 517 of the portable electronic device 51, so as to position the portable electronic device 51 on the supporting component 86 stably. In this embodiment, four positioning components 862 are disposed on the supporting component 86, and four openings 517 are disposed on the portable electronic device 51. Amounts and positions of the positioning component 862 and the opening 517 are not limited to this embodiment, and it depends on practical design demands.

Furthermore, as shown in FIG. 11 and FIG. 12, the testing system 50 of the present invention further includes a foolproof unit 90 disposed on the supporting component 86 and electrically connected to the control unit 70. The foolproof unit 90 is for generating a signal as the portable electronic device 51 is disposed on the supporting component 86 to press the foolproof unit 90, and the control unit 70 is further for controlling the plug testing unit 84 as receiving the signal generated by the foolproof unit 90. In this embodiment, the testing system 50 of the present invention includes two foolproof units 90, but is not limited to it. As the portable electronic device 51 is disposed on the supporting component 86 correctly and is perpendicular to the supporting component 86 exactly, the two foolproof units 90 are activated to generate the signal to the control unit 70. At this time, the control unit 70 can determine that the portable electronic device 51 is positioned on the supporting component 86 exactly, and then the control unit 70 controls the plug module 88 to perform the testing operation. However, as the portable electronic device 51 is disposed on the supporting component 86, but the portable electronic device 51 does not contact the two foolproof units 90 at the same time, it means that the portable electronic device 51 is not disposed on the portable electronic device 51 correctly. Therefore, the control unit 70 does not control the plug module 88 to perform the testing operation, so that it can prevent the plug module 88 from scratching the appearance of the portable electronic device 51.

In contrast to the prior art, the testing system of the present invention includes the first driving mechanism, the second driving mechanism, the third driving mechanism and the control unit. As the control unit controls the first driving mechanism to drive the platform to get close to the portable electronic device, and the control unit controls the second driving mechanism and the third driving mechanism to drive the locating component to press the portable electronic device, so that it can test whether the keyboard module, the touch module, the fingerprint identification module, the display module and the image capturing module operate normally. In addition, the testing system further includes the plug testing unit, and the control unit controls the plug testing unit to test whether the sockets of the portable electronic device operate normally. Therefore, the testing system of the present invention can solve the conventional problem that all tests have to be performed by the operator in factory, resulting in wasting a lot of manpower and time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing system for testing a portable electronic device, comprising:
   a base for supporting the portable electronic device;
   a frame installed on the base;
   two connecting components;
   a platform disposed between the base and the frame and movably installed on the two connecting components, two guiding tracks and a sliding component being respectively disposed under two sides of the platform, and the sliding component being slidably installed on the two guiding tracks;
   a first driving mechanism connected to the platform for driving the platform to move in a first direction along the two connecting components;
   a second driving mechanism connected to the sliding component, the second driving mechanism being for driving the sliding component to move in a second direction along the two guiding tracks;
   a guiding component, two ends of the guiding component being connected to two ends of the sliding component respectively;
   a locating component sheathing the guiding component, the locating component comprising a roller;
   a third driving mechanism disposed on the sliding component and connected to the locating component, the third driving mechanism being for driving the locating component to move in a third direction along the guiding component; and
   a control unit for controlling the first driving mechanism to drive the platform to move in the first direction, so that the roller of the locating component presses the portable electronic device, and the control unit being further for controlling the second driving mechanism and the third driving mechanism to drive the locating component to move in the second direction and the third direction.

2. The testing system of claim 1, wherein the first driving mechanism comprises:
   a first driving rod connected to the platform; and
   a first driving component installed on the frame and connected to the first driving rod, the first driving component being for driving the first driving rod to move the platform in the first direction along the two connecting components.

3. The testing system of claim 2, wherein the second driving mechanism comprises:
   a moving component connected to the sliding component;
   a second driving rod passing through the moving component; and
   a second driving component connected to the second driving rod, the second driving component being for driving the second driving rod to move the moving component in the second direction, so as to drive the sliding component to move in the second direction along the two guiding tracks.

4. The testing system of claim 3, wherein the third driving mechanism further comprises:
   a third driving rod passing through the locating component and connected to the sliding component; and
   a third driving component connected to the third driving rod, the third driving component being for driving the third driving rod to move the locating component in the third direction along the guiding component.

5. The testing system of claim 4, wherein the first driving component is a cylinder, and the second driving component and the third driving component are motors, respectively.

6. The testing system of claim 1, further comprising:
   a testing rod; and
   a fourth driving mechanism installed on the locating component and connected to the testing rod, and the control unit being further for controlling the fourth driving mechanism to drive the testing rod and controlling the second driving mechanism and the third driving mechanism to drive the locating component, so as to drive the fourth driving mechanism and the testing rod, so that the testing rod contacts against a touch module of the portable electronic device.

7. The testing system of claim 6, wherein an end of the testing rod for contacting against the touch module is made of conductive material with a print, and the control unit is further for controlling the fourth driving mechanism to drive the testing rod, so that the end of the testing rod contacts against a fingerprint identification module of the portable electronic device.

8. The testing system of claim 6, wherein the fourth driving mechanism is a cylinder.

9. The testing system of claim 1, wherein the roller is made of resilient material.

10. The testing system of claim 1, further comprises a distance sensing unit electrically connected to the control unit and disposed on an end of the platform nearby the portable electronic device for sensing a distance between a display module of the portable electronic device and the end of the platform, and the control unit being further for controlling operation of the testing system according to a sensing result of the distance sensing unit.

11. The testing system of claim 10, wherein the distance sensing unit is an ultrasound sensing device.

12. The testing system of claim 1, further comprising:
   a fixing frame connected to an end of the platform; and
   a reflecting component disposed on the fixing frame, and the reflecting component being for reflecting an image displayed on a display module of the portable electronic device, so that an image capturing module of the portable electronic device captures the image reflected by the reflecting component, so as to determine whether the display module and the image capturing module operate normally according to the image reflected by the reflecting component and captured by the image capturing module.

13. The testing system of claim 1, further comprising a plug testing unit electrically connected to the control unit, and the plug testing unit comprising:
   a supporting component disposed on the base for supporting the portable electronic device; and
   a plug module disposed on the supporting component, the plug module being aligned to a socket of the portable electronic device, and the control unit being further for controlling the plug module to insert into or unplug from the socket.

14. The testing system of claim 13, wherein the plug module comprises:
   a plug component for inserting into the socket;
   a pushing component connected the plug component;
   two guiding blocks for guiding movement of the pushing component; and
   a cylinder connected to the pushing component, and the control unit being further for controlling the cylinder to drive the pushing component to drive the plug component to insert into the socket of the portable electronic device.

15. The testing system of claim 13, wherein at least one positioning column is disposed on the base, at least one positioning hole is disposed on the supporting component, and the at least one positioning column is engaged with the at least one positioning hole, so as to locate the supporting component on the base.

16. The testing system of claim 13, wherein at least one positioning component is disposed on the supporting component, and the at least one positioning component is for inserting into an opening of the portable electronic device, so as to position the portable electronic device on the supporting component.

17. The testing system of claim 13, further comprising a foolproof unit disposed on the supporting component and electrically connected to the control unit, the foolproof unit being for generating a signal as the portable electronic device is disposed on the supporting component to press the foolproof unit, and the control unit being further for controlling the plug testing unit as receiving the signal generated by the foolproof unit.

* * * * *